United States Patent
Wright

(10) Patent No.: US 7,259,968 B2
(45) Date of Patent: Aug. 21, 2007

(54) TAILORING IMPEDANCES OF CONDUCTIVE TRACES IN A CIRCUIT BOARD

(75) Inventor: Mitchel E. Wright, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 464 days.

(21) Appl. No.: 10/437,619

(22) Filed: May 14, 2003

(65) Prior Publication Data

US 2004/0228100 A1 Nov. 18, 2004

(51) Int. Cl.
*H05K 1/11* (2006.01)
*H05K 1/14* (2006.01)

(52) U.S. Cl. .................. 361/794; 361/780; 361/795

(58) Field of Classification Search ........ 361/777–780; 333/12, 185, 1–5, 323

See application file for complete search history.

(56) References Cited

U.S. PATENT DOCUMENTS

| | | | |
|---|---|---|---|
| 5,682,124 A * | 10/1997 | Suski | ............................ 333/1 |
| 5,719,749 A | 2/1998 | Stopperan | |
| 6,075,423 A | 6/2000 | Saunders | |
| 6,077,309 A | 6/2000 | Lin | |
| 6,084,779 A | 7/2000 | Fang | |
| 6,143,401 A * | 11/2000 | Fischer et al. | ........... 428/322.7 |
| 6,215,320 B1 | 4/2001 | Parrish | |
| 6,256,769 B1 | 7/2001 | Tamarkin et al. | |
| 6,392,301 B1 | 5/2002 | Waizman et al. | |
| 6,445,204 B1 * | 9/2002 | He et al. | .................... 324/763 |
| 6,480,395 B1 | 11/2002 | Kopf | |
| 6,590,466 B2 * | 7/2003 | Lin et al. | ........................ 333/1 |
| 6,759,921 B1 * | 7/2004 | Govind et al. | ................. 333/34 |

* cited by examiner

*Primary Examiner*—Tuan T. Dinh

(57) ABSTRACT

A multi-layer circuit board includes a first layer having at least first and second conductive traces of different widths and the same impedance. One of a first power plane and first ground plane has a void region such that the first conductive trace is spaced apart from the first power plane by a first thickness, and the second conductive trace is spaced apart from the first ground plane by a second, different thickness.

12 Claims, 2 Drawing Sheets

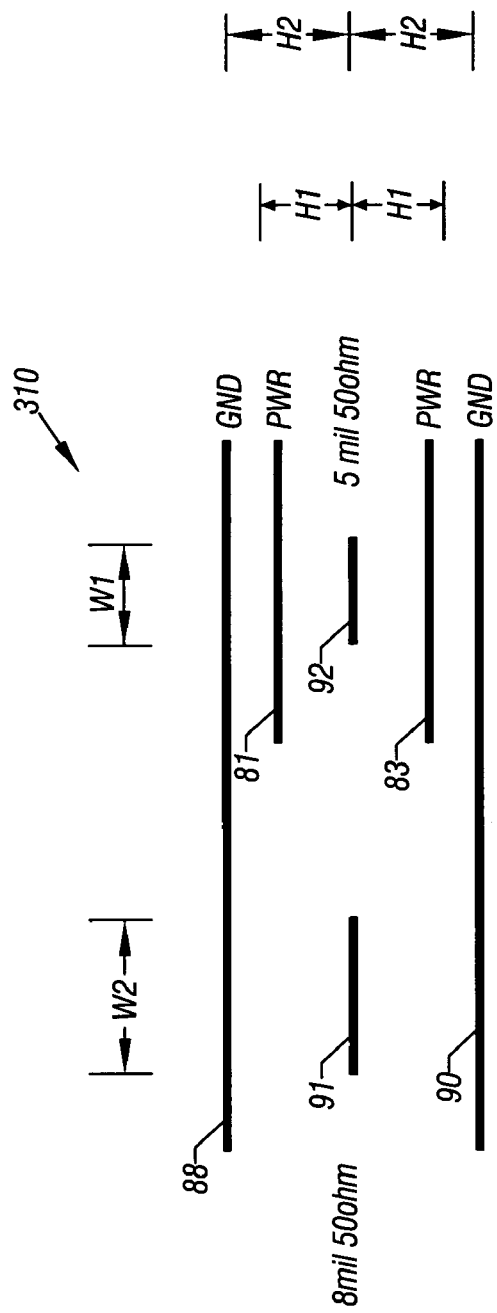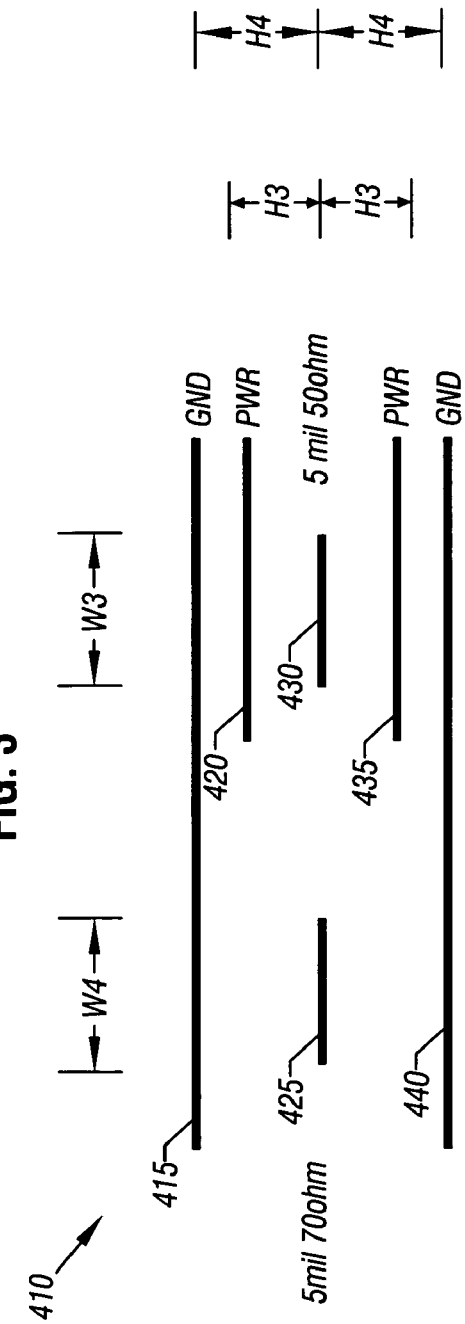

TAILORING IMPEDANCES OF CONDUCTIVE TRACES IN A CIRCUIT BOARD

BACKGROUND

A circuit board, that may be a printed circuit board (PCB), includes many layers of conducting and nonconducting material. The PCB contains signal traces connecting the input and output pins of electronic components that may perform a particular function or set of functions. Examples of components that may be integrated within a PCB include memory devices, application specific integrated circuits (ASICs) and processing devices such as digital signal processors (DSPs). Each PCB may have one or more ground planes and power planes that connect to the electronic components.

In a PCB, electronic components are connected to each other through signal traces. In order to route in and out of the small pins of the electronic components, the signal traces may have to be of the same sufficiently narrow width. Some of the signal traces connecting electronic components may have to be of low impedance and low direct current (DC) resistance to carry high frequency and other types of signals. Because the impedance and resistance of a signal trace generally decreases with increasing trace width or, vice-versa, increases with decreasing trace width, the narrow width for routing generally makes the trace impedance and resistance high.

Signals being driven between the electronic components through the signal traces on the same layer of the PCB may be subject to detrimental impedance effects. One manifestation of these impedance effects is unwanted reflections due to impedance mismatches. The signals may also be prone to cross-talk and electromagnetic interference (EMI).

The impedance of a trace is also affected by the distance between the trace and adjacent conducting planes on layers above and below the trace. Thus, the conflicting requirements described for the two situations above suggest that for each situation the signal traces be routed on separate layers. However, the additional layers needed to provide route paths may increase the cost of a PCB.

BRIEF DESCRIPTION OF THE DRAWINGS

FIG. 3 shows the layers of conductive material in the multi-layer PCB of FIG. 2 with different trace widths and same impedance in accordance with an embodiment of the present invention; and FIG. 4 shows layers of conductive material of FIG. 2 with same trace widths and different impedances in accordance with another embodiment of the present invention.

DETAILED DESCRIPTION

Figure 1:
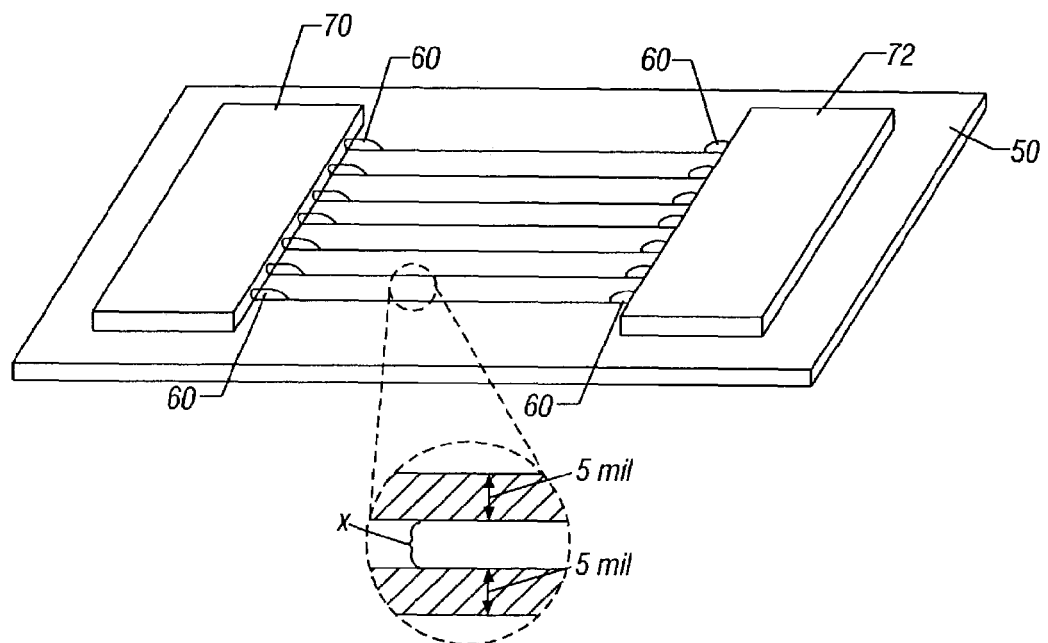
FIG. 1 shows an example of a PCB with an array of signal traces.

Referring to FIG. 1, an example of an array of signal traces between first and second electronic components 70 and 72 is shown. In this example, the signal traces are 5 mil (a mil being equal to 1/1000 of an inch) in width while the distance x between adjacent signal traces may be large enough so that there are no contributions to a trace impedance from its adjacent traces. The signal traces connect electronic components 70 and 72 through input/output pins 60. In the example shown in FIG. 1, the signal traces are on the mounting layer 50 of the PCB; however, in other examples as described below with reference to FIG. 2, the signal traces may be sandwiched between adjacent layers of the PCB. Signal traces on a layer embedded between adjacent layers be coupled by input/output pins 60. A via travels vertically through the adjacent layers to connect to respective structures at its two ends.

Figure 2:
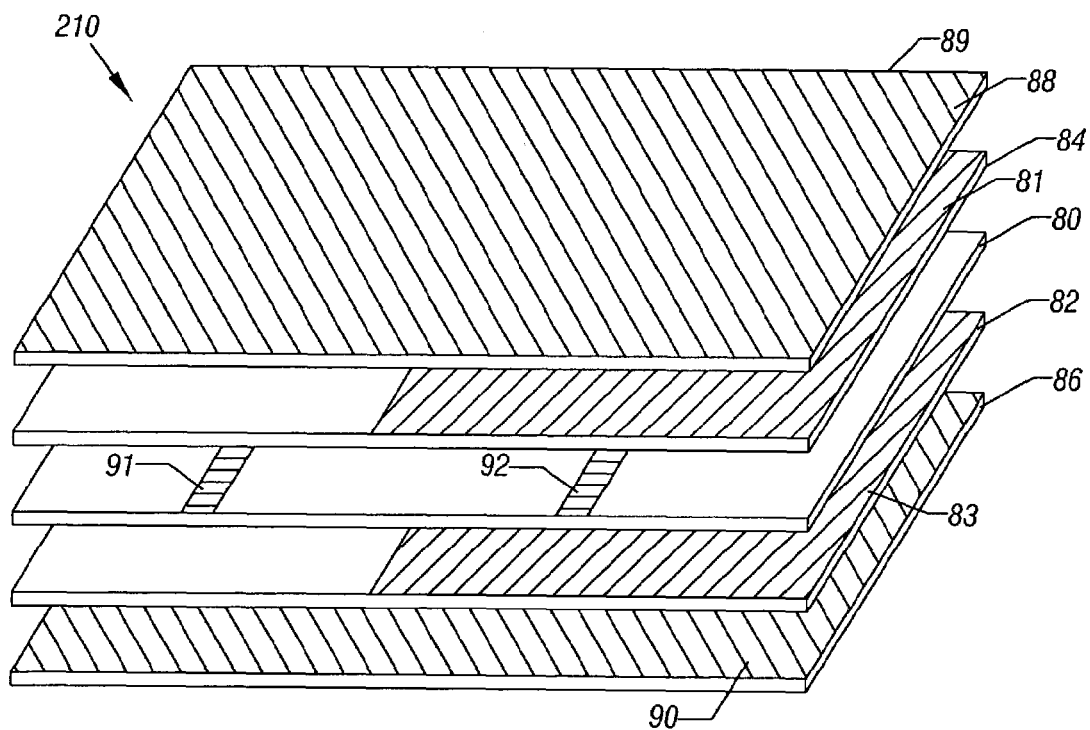
FIG. 2 shows a perspective view of some of the layers of a multi-layer PCB in accordance with embodiments of the present invention.

Turning now to FIG. 2, some of the layers 210 of a sample multi-layer PCB are shown. These layers 210 typically include one or more signaling layers as well as a plurality of power and ground layers that, in some embodiments of the invention, are placed above and below the signaling layers. In some embodiments, the complete PCB may have a total of 6 to 20 layers with the top and bottom layers (not shown in FIG. 2) containing electronic components mounted on these layers. Layers containing conducting material such as copper may be sandwiched between nonconducting dielectric layers. Thus, as shown in FIG. 2, first layer 80 containing copper signal traces 91 and 92 and second layer 84 containing copper power plane 81 include a dielectric layer between them. The portion of the multi-layer PCB shown in FIG. 2 may also include a ground plane 88 on third layer 89, a fourth layer 82 containing power plane 83, and fifth layer 86 containing ground plane 90. Thus, the multilayer PCB may include a total of five copper layers and four dielectric layers (shown in FIG. 2) between the copper layers. In some implementations, the copper conductive material on the signal trace, power plane, and ground plane layers may be formed onto nonconducting materials such as a dielectric to create the signal traces, power plane and ground plane on each respective layer. Thus, for example as shown in FIG. 2, the whole top surface of third layer 89 may be formed with copper conducting materials to form ground plane 88. In a similar fashion, power plane 81 may be formed by depositing the whole top surface of second layer 84 with copper conductive material and then removing half of the copper to form a void.

Referring now to FIG. 3, the layers of FIG. 2 are shown. In FIG. 3, traces 91 and 92 have respective widths W2 and W1, with W2 greater than W1. The ground plane 88 extends substantially the whole width of third layer 89, while power plane 81 extends approximately half the width of second layer 84. In some embodiments of the invention, to provide a low impedance power plane, the power plane and ground plane may be combined into closely spaced pairs as shown in FIG. 3. Removing part of the power plane in each of the closely spaced pairs allows traces with the same impedance but different widths to be placed on the same routing layer 80. This is because, as mentioned above, the impedance of a trace is formed by the width of the trace and the thickness of the dielectric between the trace layers and a power/ground layer, determined by the distance between the trace and adjacent planes on layers above and below the trace. Thus, as shown in FIG. 3 for some embodiments of the invention, the impedance of signal trace 92 is determined by its width W1 and the dielectric thickness to the power planes 81 and 83. Each of the dielectric thicknesses between power planes 81 and 83 and the signal trace 92 is H1. The impedance of the signal trace 91 is determined by its width W2 and dielectric thicknesses to the ground planes 88 and 90. These thicknesses are each H2. Thus, even though signal trace 91 has a broader width than signal trace 92, the impedances of the signal traces 91 and 92 can be matched by varying dielectric thicknesses between the traces 91 and 92 and respective power/ground layers. For example, the impedance of each of the signal traces 91 and 92 can be set at 50 ohms.

Thus, as shown in FIG. 3, portions of the power planes 81 and 83 at regions above and below the signal trace 91 are removed to increase the effective dielectric thickness of the signal trace 91 to a power/ground plane.

Referring now to FIG. 4, layers of a PCB according to another embodiment are shown. The layers 80 includes signal traces 425 and 430, each having the same width. The layers also include a ground plane 415 extending substantially the width of third layer 89 and power plane 420 extending approximately half the width of second layer 84. Removing part of the power plane in each of the closely spaced power plane/ground plane pairs allows traces with the same width but different impedances to be placed on the same routing layer. This is because, as mentioned above, the impedance of a trace is formed by the width of the trace and the dielectric thickness between the trace and adjacent planes on layers above and below the trace. By varying the dielectric thicknesses between signal traces 425 and 430 and respective power/ground planes, the impedances of signal traces 425 and 430 are set to different values. For example, the signal trace 425 has an impedance of 70 ohms, while the signal trace 430 has an impedance of 50 ohms.

Again, portions of the power planes 420 and 435 in regions above and below the signal trace 425 are removed to increase the effective dielectric thickness between the signal trace 425 and power/ground planes. More generally, tailoring of the impedance of a signal trace is achieved by removing portions of a power or ground plane in regions that are vertically above and below the signal trace. This effectively creates an opening or void region in the power or ground plane. The opening in void region lacks the electrically conductive material (e.g., copper) making up the power or ground plane. The opening or void region is located vertically above or below the signal trace.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method, comprising:

placing at least first and second conductive traces of different widths and same impedance on a first layer, wherein said first layer is one layer in a multi-layer circuit board; and providing a power plane and a ground plane, wherein one of the power plane and ground plane has a first void region such that the first conductive trace is spaced apart from the power plane by a first thickness, and the second conductive trace is spaced apart from the ground plane by a second, different thickness, wherein the power plane is placed on a second layer of the multi-layer circuit board, and wherein the ground plane is placed on a third layer of the multi-layer circuit board;

removing a portion of one of the power and ground planes to form the first void region, said first void region resulting in the traces having the same impedance;

placing another power plane on a fourth layer;

placing another ground plane on a fifth layer; and removing a portion of the fourth layer power plane to form a second void region in the fourth layer power plane, said second void region resulting in the traces having the same impedance.

2. The method of claim 1, further comprising:

providing a first dielectric layer having the first thickness between the first conductive trace and the second layer power plane; and providing a second dielectric layer having the second, different thickness between the second conductive trace and the third layer ground plane.

3. The method of claim 1, wherein the first thickness between the first conductive trace and the second layer power plane allows the first conductive trace to have the same impedance, and wherein the second thickness between the second conductive trace and the third layer ground plane allows the second conductive trace to have the same impedance.

4. A multi-layer circuit board, comprising:

a first layer, wherein said first layer includes at least first and second conductive traces of different widths and same impedance;

a first power plane and a first ground plane, wherein one of the first power plane and first ground plane has a first void region such that the first conductive trace is spaced apart from the first power plane by a first thickness, and the second conductive trace is spaced apart from the first ground plane by a second, different thickness; and a second power plane and a second ground plane, wherein one of the second power plane and second ground plane has a second void region such that the first conductive trace is spaced apart from the second power plane by the first thickness, and the second conductive trace is spaced apart from the second ground plane by the second thickness.

5. The multi-layer circuit board of claim 4, wherein the power and ground planes are formed of a conductive material, and wherein the void regions lack the conductive material.

6. The multi-layer circuit board of claim 4, further comprising a first dielectric layer of the first thickness between the first conductive trace and the first power plane, and a second dielectric layer of the second thickness between the second conductive trace and the first ground place.

7. The multi-layer circuit board of claim 4, further comprising:

a first dielectric layer of the first thickness between the first conductive trace and the first power plane;

a second dielectric layer of the second thickness between the second conductive trace and the first ground place;

a third dielectric layer of the first thickness between the first conductive trace and the second power plane; and a fourth dielectric layer of the second thickness between the second conductive trace and the second ground plane.

8. The multi-layer circuit board of claim 4, wherein the first thickness is less than the second thickness.

9. The multi-layer circuit board of claim 4, wherein the first thickness between the first conductive trace and the first power plane allows the first conductive trace to have the same impedance, and wherein the second thickness between the second conductive trace and the first ground plane allows the second conductive trace to have the same impedance.

10. The multi-layer circuit board of claim 4, further comprising a second layer including the first power plane, and a third layer including the first ground plane, wherein the second and third layers are above the first layer.

11. The multi-layer circuit board of claim 4, further comprising a second layer including the first power plane, and a third layer including the first ground plane, wherein the second and third layers are below the first layer.

12. The multi-layer circuit board of claim 8, wherein the first conductive trace has a first width, and the second conductive trace has a second width that is greater than the first width.

* * * * *